(12) United States Patent
Hiroki

(10) Patent No.: US 12,261,060 B2
(45) Date of Patent: Mar. 25, 2025

(54) SUBSTRATE PROCESSING APPARATUS AND STAGE CLEANING METHOD

(71) Applicant: TOKYO ELECTRON LIMITED, Tokyo (JP)

(72) Inventor: Tsutomu Hiroki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 943 days.

(21) Appl. No.: 17/028,702

(22) Filed: Sep. 22, 2020

(65) Prior Publication Data

US 2021/0098269 A1 Apr. 1, 2021

(30) Foreign Application Priority Data

Sep. 27, 2019 (JP) ................. 2019-177480

(51) Int. Cl.
*H01L 21/67* (2006.01)
*C23C 16/44* (2006.01)
(Continued)

(52) U.S. Cl.
CPC .... *H01L 21/67023* (2013.01); *C23C 16/4401* (2013.01); *H01J 37/32862* (2013.01);
(Continued)

(58) Field of Classification Search
CPC .......... H01J 37/32862; H01J 37/32697; H01J 37/32715–32724; H01J 37/32853–32871; H01J 2237/022; H01L 21/67069; H01L 21/67098–67115; H01L 21/6831–6833; C23C 16/4405; C23C 16/4407; C23C 16/4401–4409
See application file for complete search history.

(56) References Cited

U.S. PATENT DOCUMENTS

| 5,085,750 A | * | 2/1992 | Soraoka | ............ H01L 21/68714 |
| | | | | 118/724 |
| 2004/0000321 A1 | * | 1/2004 | Cui | ................... H01J 37/32862 |
| | | | | 134/1.2 |

(Continued)

FOREIGN PATENT DOCUMENTS

| JP | 2003174016 A | * | 6/2003 |
| JP | 2005089864 A | * | 4/2005 |

(Continued)

*Primary Examiner* — Mikhail Kornakov
*Assistant Examiner* — Richard Z. Zhang
(74) *Attorney, Agent, or Firm* — Fenwick & West LLP

(57) ABSTRACT

A substrate processing apparatus includes a stage on which a substrate to be processed is placed, a liquid supply unit for supplying liquid for controlling a temperature of the substrate to the stage, a flow path formed in the stage and through which the supplied liquid flows, a liquid receiving unit for receiving the liquid discharged from the flow path, a heater for heating the stage to a temperature higher than a usable temperature range of the liquid to remove deposits adhered to the stage, a gas supply unit for supplying a gas to the flow path, and a controller. The controller is configured to switch fluid in the flow path from the liquid supplied from the liquid supply unit to the gas supplied from the gas supply unit, and to control the heater to heat the stage after replacement of the fluid in the flow path with the gas.

8 Claims, 10 Drawing Sheets

(51) Int. Cl.
*C23C 16/458* (2006.01)
*H01J 37/32* (2006.01)
*H01L 21/285* (2006.01)
*H01L 21/687* (2006.01)

(52) U.S. Cl.
CPC .. *H01L 21/28562* (2013.01); *H01L 21/67115* (2013.01); *H01L 21/67248* (2013.01); *H01L 21/68714* (2013.01); *C23C 16/4586* (2013.01)

(56) References Cited

U.S. PATENT DOCUMENTS

| | | | | |
|---|---|---|---|---|
| 2005/0279384 | A1* | 12/2005 | Guidotti | C23C 16/52 156/345.1 |
| 2010/0326094 | A1* | 12/2010 | Tandou | H01J 37/32091 62/298 |
| 2012/0052690 | A1* | 3/2012 | Belostotskiy | H01L 21/6831 438/715 |
| 2015/0377571 | A1* | 12/2015 | Hiroki | H01J 37/32724 165/296 |
| 2016/0104605 | A1* | 4/2016 | Hiroki | H01J 37/32798 62/160 |
| 2018/0305814 | A1* | 10/2018 | Fox | C23C 16/45525 |

FOREIGN PATENT DOCUMENTS

| | | | |
|---|---|---|---|
| JP | 2009-013504 A | | 1/2009 |
| KR | 10-2006-0129318 A | | 12/2006 |
| KR | 10-2015-0010720 A | | 1/2015 |
| KR | 10-2016-0001669 A | | 1/2016 |
| WO | WO1998045875 A1 | * | 10/1998 |
| WO | WO 2013/162848 A1 | | 10/2013 |

* cited by examiner

SUBSTRATE PROCESSING APPARATUS AND STAGE CLEANING METHOD

CROSS-REFERENCE TO RELATED APPLICATIONS

This application claims priority to Japanese Patent Application No. 2019-177480, filed on Sep. 27, 2019, the entire contents of which are incorporated herein by reference.

TECHNICAL FIELD

The present disclosure relates to a substrate processing apparatus and a stage cleaning method.

BACKGROUND

In a semiconductor device manufacturing process, various treatments such as film formation, etching, and the like are performed by supplying various processing gases in a state where a semiconductor wafer (hereinafter referred to as "wafer") that is a substrate is placed on a stage. In such treatments, deposits may be generated due to a reaction of a processing gas for film formation on a surface of the stage, or substances removed from the wafer by etching may be adhered onto the stage. Therefore, cleaning for removal of the deposits is performed by heating the stage.

Japanese Patent Application Publication No. 2009-13504 discloses a technique for performing a flushing process for supplying a cleaning gas while heating a shower head for supplying a film forming gas to remove reaction by-products adhered to the shower head. A coolant path is formed in the shower head, and reaction of a gas on a surface of the shower head is suppressed by allowing cooling water to flow through the coolant path. During the flushing process, the supplying of cooling water is stopped and the cooling water remaining in the coolant path is heated by a heater and boiled to be eliminated, realizing efficient heating of the shower head.

The present disclosure provides a technique for cleaning a stage while avoiding influence on a temperature adjusting liquid caused by heating of the stage.

SUMMARY

In accordance with an aspect of the present disclosure, there is provided a substrate processing apparatus including: a stage on which a target substrate is placed; a liquid supply unit configured to supply liquid for controlling a temperature of the substrate to the stage; a flow path formed in the stage and through which the liquid supplied from the liquid supply flows; a liquid receiving unit configured to receive the liquid discharged from the flow path; a heater configured to heat the stage to a temperature higher than a usable temperature range of the liquid to remove deposits adhered to the stage; a gas supply unit configured to supply a gas to the flow path; and a controller. The controller is configured to switch fluid in the flow path from the liquid supplied from the liquid supply unit to the gas supplied from the gas supply unit, and to control the heater to heat the stage after replacement of the fluid in the flow path with the gas.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
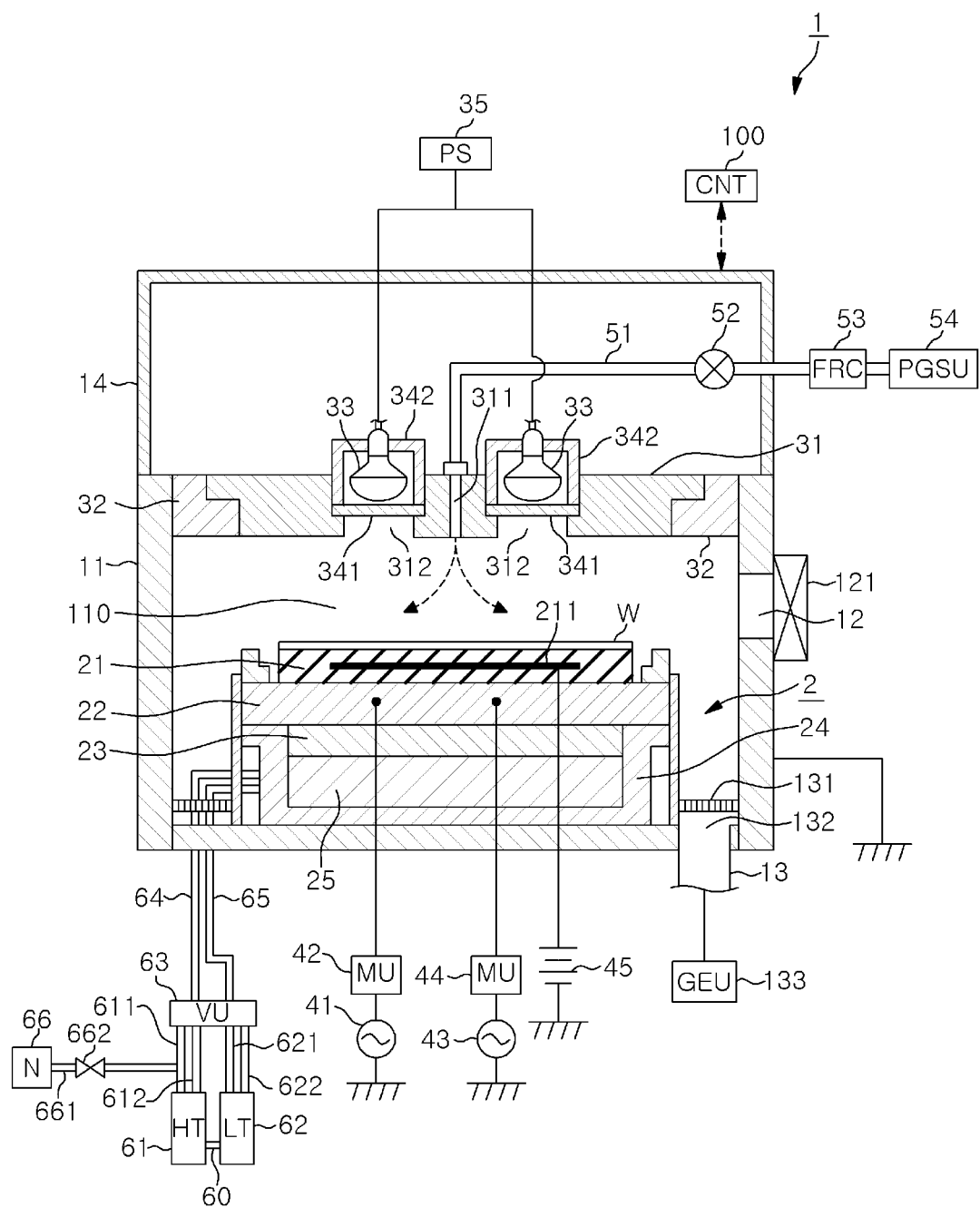
FIG. 1 is a vertical cross-sectional side view of a substrate processing apparatus according to an embodiment.

Hereinafter, a configuration of the substrate processing apparatus 1 according to an embodiment will be described with reference to FIGS. 1 to 6. FIG. 1 is a vertical cross-sectional side view of the substrate processing apparatus 1.

The substrate processing apparatus 1 of this example is configured as, e.g., a capacitively coupled plasma processing apparatus. The substrate processing apparatus 1 includes a substantially cylindrical chamber 11. The chamber 11 has therein a processing space 110 for processing a wafer W that is a substrate. The chamber 11 is made of a metal such as aluminum and is electrically grounded. A plasma-resistant film made of aluminum oxide, yttrium oxide, or the like is formed on an inner surface of the processing space 110.

A loading/unloading port 12 for loading/unloading the wafer W into/from the processing space 110 is formed on a sidewall of the chamber 11. The loading/unloading port 12 can be opened and closed by a gate valve 121.

A stage 2 is disposed at a bottom portion of the chamber 11. The stage 2 is configured to place the wafer W on a substrate supporting surface formed on an upper surface thereof. The stage 2 includes an electrostatic chuck 21, a plate 22, and a collective pipe unit 23. A specific configuration of the stage 2 will be described later.

The substrate processing apparatus 1 includes an electrode plate 31 serving as an upper electrode. The electrode plate 31 is disposed above the stage 2 via a space in the processing space 110. The electrode plate 31 is supported by a supporting member 32 at an upper portion of the chamber 11. The electrode plate 31 is made of a semiconductor or a conductor with low resistance and low Joule heating, and is grounded through the supporting member 32 and the chamber 11. When an RF power supply is connected to the electrode plate 31 as in an example to be described later, the supporting member 32 for supporting the electrode plate 31 is made of an insulating member.

A gas injection hole 311 is formed at a central portion of the electrode plate 31 in plan view. The gas injection hole 311 opens at an upper surface of the electrode plate 31 and is connected to a processing gas supply line 51. A processing gas supply line 51 is connected to a processing gas supply unit (PGSU) 54 through a valve 52 and a flow rate controller (FRC) 53. For example, the flow rate controller 53 is, e.g., a mass flow controller or a pressure control type flow rate controller. A processing gas used for processing the wafer W in the substrate processing apparatus 1 is supplied from the processing gas supply unit 54. The processing gas supplied from the processing gas supply unit 54 through the processing gas supply line 51 is injected into the processing space 110 through the gas injection hole 311.

For example, when the wafer W is processed to form a film, a source gas containing a film source material is supplied alone as a processing gas, or is supplied alternately with a reaction gas that reacts with the source gas. When the wafer W is etched, an etching gas is supplied as the processing gas.

A gas exhaust path is formed between a sidewall of the chamber 11 and the stage 2. A baffle plate 131 is disposed in the middle of the gas exhaust path. The baffle plate 131 has a plurality of holes penetrating therethrough in a plate thickness direction.

A gas exhaust port 132 is disposed at a bottom portion of the chamber 11 under the baffle plate 131. A gas exhaust unit (GEU) 133 is connected to the gas exhaust port 132 through a gas exhaust line 13. The gas exhaust unit 133 includes a pressure controller and a vacuum pump such as a turbo molecular pump.

The substrate processing apparatus 1 includes a first RF power supply 41, a matching unit (MU) 42, a second RF power supply 43, and a matching unit (MU) 44.

The first RF power supply 41 outputs an RF power for plasma generation. The RF power outputted from the first RF power supply 41 has a frequency of 27 MHz or higher, e.g., 40 MHz. The first RF power supply 41 is connected to the plate 22 through the matching unit 42. The RF power outputted from the first RF power supply 41 is supplied to the plate 22 through the matching unit 42. The matching unit 42 includes a matching circuit for matching a load side impedance of the first RF power supply 41 with an output impedance of the first RF power supply 41. Further, the first RF power supply 41 may be connected to the electrode plate 31 through the matching unit 42.

The second RF power supply 43 outputs a RF power for attracting ions to the wafer W. The RF power outputted from the second RF power supply 43 has a frequency of 13.56 MHz or lower, e.g., 3 MHz. The second RF power supply 43 is connected to the plate 22 through the matching unit 44. The RF power outputted from the second RF power supply 43 is supplied to the plate 22 through the matching unit 44. The matching unit 44 includes a matching circuit for matching a load side impedance of the second RF power supply 43 with an output impedance of the second RF power supply 43.

Figure 2:
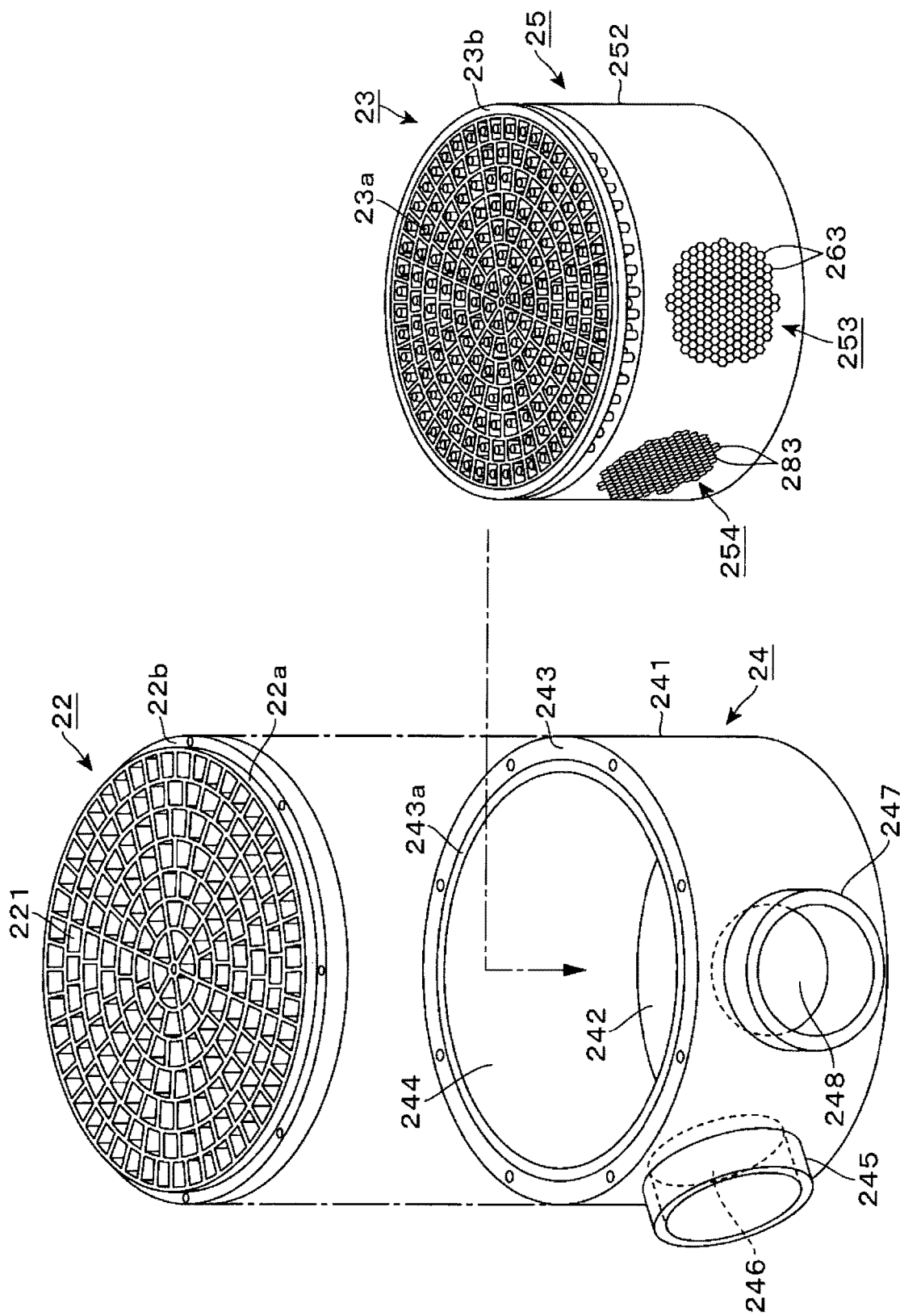
FIG. 2 is an exploded perspective view of a stage of the substrate processing apparatus.
Figure 3:
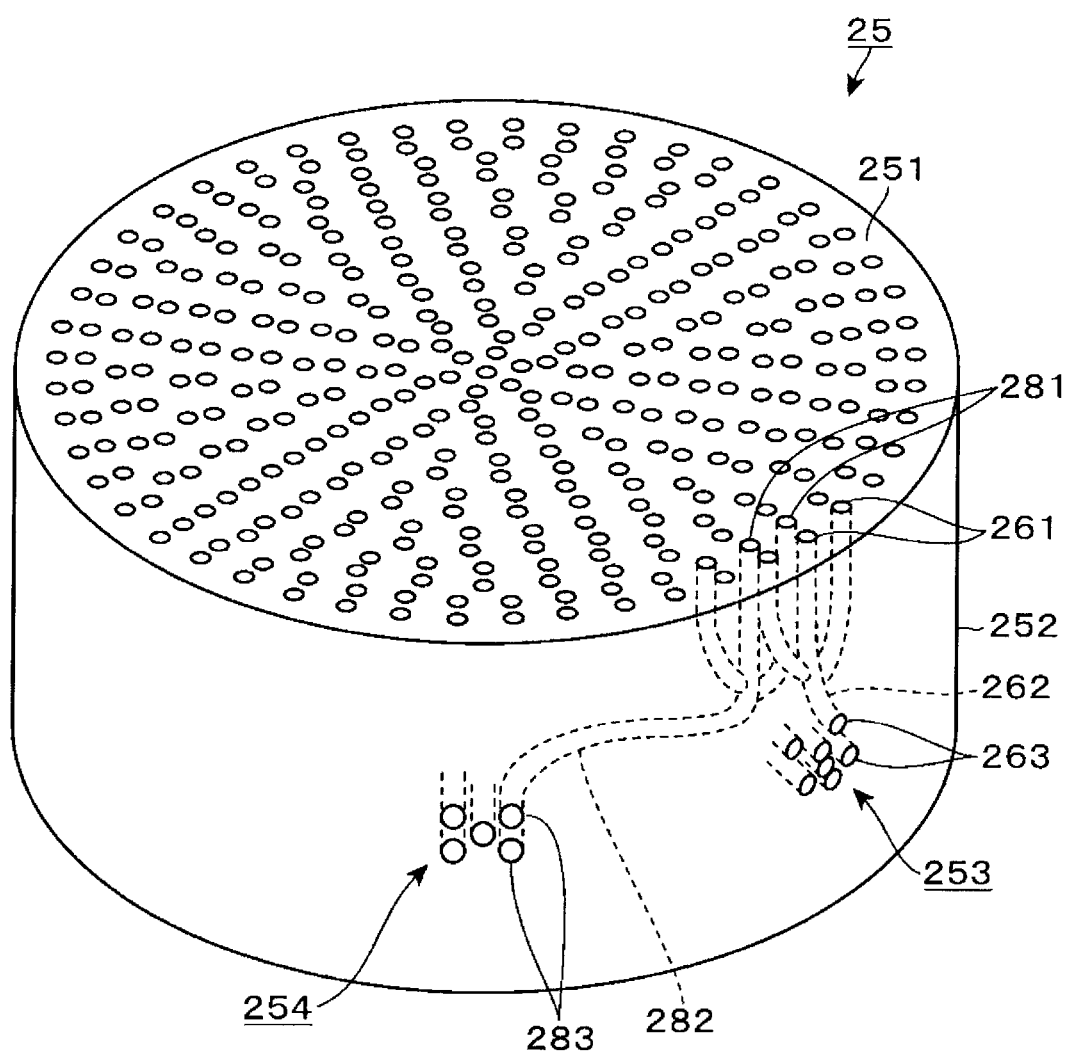
FIG. 3 is a perspective view of an intermediate flow path constituting the stage.
Figure 4:
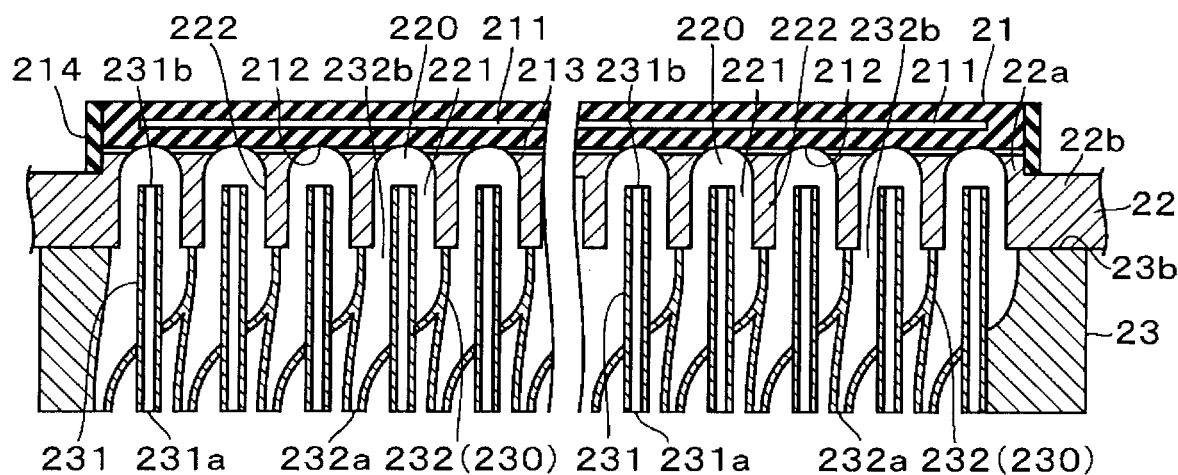
FIG. 4 is a vertical cross-sectional side view of an upper side of the stage.

The stage 2 will be described in detail with reference to FIGS. 2 to 4 in addition to FIG. 1 described above. FIGS. 2 and 3 are exploded perspective views of the stage 2. FIG. 4 is a vertical cross-sectional view showing an enlarged part of the stage 2.

As shown in FIG. 1, the electrostatic chuck 21 is formed in a substantially disc shape and has on an upper surface thereof a substrate supporting area on which the wafer W is placed. The electrostatic chuck 21 has a structure in which a chuck electrode 211 made of a conductive film is embedded between two insulating layers or two insulating sheets made of, e.g., ceramic. A DC power supply 45 is connected to the chuck electrode 211, and the wafer W can be fixed and held on the electrostatic chuck 21 by an electrostatic force such as a Coulomb force or the like generated by applying a DC voltage.

A plate 22 is disposed below the electrostatic chuck 21. The plate 22 has a substantially disc shape and supports the electrostatic chuck 21 from a bottom surface thereof. Various metals or ceramics may be adopted as a material forming the plate 22. In this example, the plate 22 is made of silicon-infiltrated titanium silicon carbide (SiSiCTi) having low thermal conductivity.

As shown in FIG. 2, the plate 22 of this example includes a disc-shaped main portion 22a disposed at a central side and an annular flange portion 22b disposed at a peripheral side. As shown in FIGS. 2 and 4, a plurality of through-holes 221 extending in the plate thickness direction of the plate 22 is formed at the main portion 22a. The through-holes 221 are formed separately from each other and arranged to form a surface below the electrostatic chuck 21. Upper openings of the through-holes 221 are blocked by the electrostatic chuck 21. Lower openings of the through-holes 221 are opened.

As shown in FIG. 4, a back surface of the electrostatic chuck 21 is adhered to the main portion 22a of the plate 22 through an adhesive layer 213. In other words, a region (the upper surface of a wall 222) where the through-holes 221 are not formed on the front surface of the plate 22 facing the back surface of the electrostatic chuck 21 is adhered to the back surface of the electrostatic chuck 21. On the other hand, a region 212 of the back surface of the electrostatic chuck 21 that is not adhered to the plate 22 is exposed toward each through-hole 221.

Further, a coating film 214 may be formed on the stage 2 to cover an outer edge of the adhesive layer 213. The coating film 214 is, e.g., an $Al_2O_3$ film formed by thermal spraying. The coating film 214 prevents the adhesive layer 213 from deteriorating due to plasma or radicals generated in the processing space 110.

A collective pipe unit 23 is disposed below the plate 22. The collective pipe unit 23 has a substantially disc shape and supports, on its upper surface, the back surface of the plate 22. The collective pipe unit 23 includes a disc-shaped main portion 23a disposed at a central side and an annular flange portion 23b disposed at a peripheral side. As shown in FIG. 4, the flange portion 23b of the collective pipe unit 23 is disposed to face the flange portion 22b of the plate 22.

As shown in FIG. 4, a plurality of first pipes 231, a plurality of second pipes 232, and a plurality of partition walls 230 are formed in a region corresponding to the main portion 23a of the collective pipe unit 23. As shown in FIG. 4, when the plate 22 is placed on the collective pipe unit 23, the upper ends of the first pipes 231 formed to protrude upward from the main portion 23a of the collective pipe unit 23 are inserted into the through-holes 221 formed in the plate 22 from the back surface side. In this state, a cell portion 220, which is a flow path through which fluid supplied from the first pipe 231 flows, is formed by an inner peripheral surface of the through hole 221, an outer peripheral surface of the first pipe 231, and the back surface of the electrostatic chuck 21. A plurality of cell portions 220 is arranged to form a surface on the back surface side of the plate 22 so as to communicate with the spaces in the collective pipe unit 23 defined by the partition walls 230.

As described above, one first pipe 231 is inserted into each cell portion 220, and each cell portion 220 communicates with one second pipe 232 via the partition wall 230.

Each first pipe 231 is a flow path having a first open end 231a at a lower end side and a second open end 231b at an upper end side. The second open end 231b at the upper end side faces the region on the back side of the electrostatic chuck 21 which is exposed toward the cell portion 220 via the through hole 221.

In each cell portion 220, each partition wall 230 surrounds the outer periphery of the first pipe 231 to form a space around the outer peripheral surface of the first pipe 231. In each cell portion 220, the partition wall 230 forms the second pipe 232 that is a flow path connecting a first open end 232a at a lower end side and a second open end 232b at an upper end side connected to the partition wall 230.

In addition, the above-described first pipe 231 penetrates through the sidewall surface of the partition wall 230 whose diameter is gradually reduced from the second opening end 232b toward the first opening end 232a, and extends to the outside of the space surrounded by the partition wall 230.

Each first pipe 231 functions as a nozzle for discharging temperature adjusting liquid supplied from a high temperature liquid supply unit (HT) 61 and a low temperature liquid supply unit (LT) 62, which will be described later, toward the cell portion 220. Further, each second pipe 232 functions as a pipe for discharging the temperature adjusting liquid discharged from the first pipe 231 and passing through the cell portion 220 to the outside of the space.

The collective pipe unit 23 may be made of various metals, ceramics, resins, or composite materials thereof. In this example, the collective pipe unit 23 is made of aluminum. The collective pipe unit 23 can be formed using, for example, a 3D printer.

As shown in FIGS. 1 and 2, the stage 2 may further include a case 24 and a connecting flow path unit 25.

The case 24 is made of a metal such as stainless steel. The case 24 has a sidewall 241 and a bottom wall 242, and defines an accommodation space 244 therein. The sidewall 241 has a cylindrical shape, and an upper end surface 243 of the sidewall 241 supports the plate 22.

As shown in FIG. 2, a supply pipe 247 and a collecting pipe 245 are provided on the sidewall 241 of the case 24. The supply pipe 247 is formed to extend outward along the radial direction of the sidewall 241, and communicates with the accommodation space 244 via a first opening portion 248. The collecting pipe 245 is formed to extend outward along the radial direction of the sidewall 241, and communicates with the accommodating space 244 via a second opening portion 246.

The collective pipe unit 23 and the connecting flow path unit 25 are accommodated in the accommodation space 244. The upper end surface 243 of the sidewall 241 may be provided with an O-ring 243a extending annularly along the upper end surface 243.

Next, the configuration of the connecting flow path unit 25 will be described with reference to FIG. 3. The connecting flow path unit 25 is disposed below the collective pipe unit 23 in the accommodation space 244, and flow paths (supply flow paths 262) for supplying the temperature adjusting liquid to the collective pipe unit 23 and flow paths (collecting flow paths 282) for collecting the temperature adjusting liquid from the collective pipe unit 23 are formed inside the connecting flow path unit 25.

As shown in FIG. 3, the connecting flow path unit 25 is a block body having a substantially cylindrical shape, and has an upper surface 251 and a side surface 252. A plurality of supply flow paths 262 and a plurality of collecting flow paths 282 are formed inside the connecting flow path unit 25. The supply flow paths 262 and the collecting flow paths 282 are formed as elongated cavities penetrating through the connecting flow path unit 25. In FIG. 3, parts of the supply flow paths 262 and the collecting flow paths 282 are indicated by broken lines.

Each of the plurality of supply flow paths 262 has a plurality of one ends 261 that open toward the upper surface 251 and a single other end 263 that opens toward the side surface 252. In the connecting flow path unit 25, each supply flow path 262 extends while being branched to connect the other end 263 with the plurality of one ends 261.

On the upper surface 251 of the connecting flow path unit 25, each one end 261 is formed at a position corresponding to the first open end 231a at the lower end side of the first pipe 231 of the collective pipe unit 23. Each one end 261 is connected to the corresponding first open end 231a of the first pipe 231.

On the other hand, the other ends 263 of the plurality of supply flow paths 262 are locally gathered at the side surface 252 of the connecting flow path unit 25 to form a first opening assembly 253. When the connecting flow path unit 25 is accommodated in the case 24, the first opening assembly 253 is disposed to face the first opening portion 248 of the case 24. For the sake of convenience of illustration, only some of the other ends 263 constituting the first opening assembly 253 are illustrated in FIG. 3.

Further, each of the plurality of collecting flow paths 282 has a plurality of one ends 281 that opens toward the upper surface 251 and single the other end 283 that opens toward the side surface 252. In the connecting flow path unit 25, each collecting flow path 282 extends while being branched to connect the other end 283 with the plurality of one ends 281.

On the upper surface 251 of the connecting flow path unit 25, each one end 281 is formed at a position corresponding to the first open end 232a at the lower end side of the second pipe 232 of the collective pipe unit 23. Each one end 281 is connected to the corresponding first open end 232a of the second pipe 232.

On the other hand, the other ends 283 of the plurality of collecting flow paths 282 are locally gathered at the side surface 252 of the connecting flow path unit 25 to form a second opening assembly 254. When the connecting flow path unit 25 is accommodated in the case 24, the second opening assembly 254 is disposed to face the second opening portion 246 of the case 24. For the sake of convenience of illustration, only some of the other ends 283 constituting the second opening assembly 254 are illustrated in FIG. 3.

The connecting flow path unit 25 configured as described above can be formed using a 3D printer.

Figure 5:
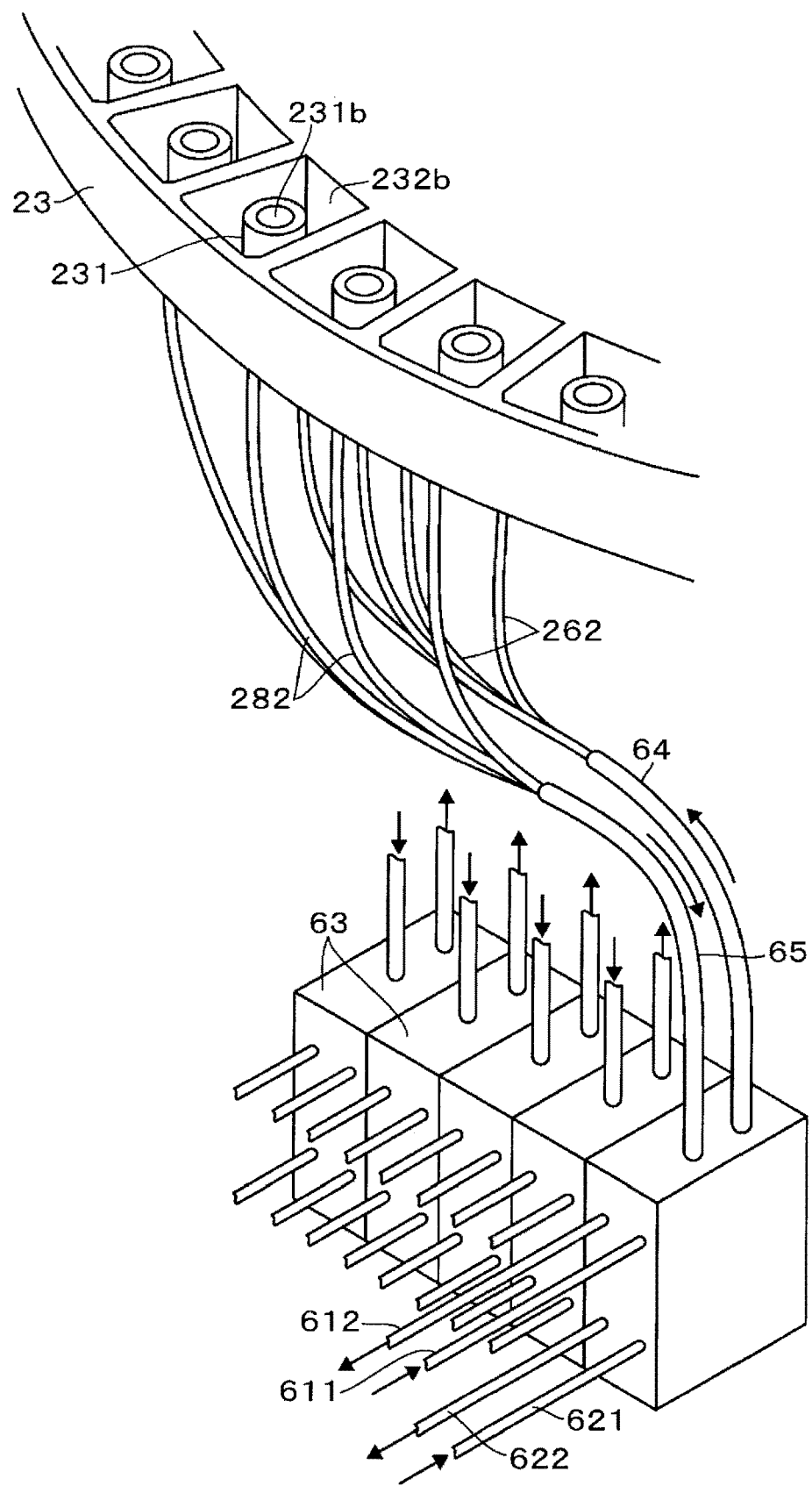
FIG. 5 is a perspective view of a valve unit group.
Figure 6:
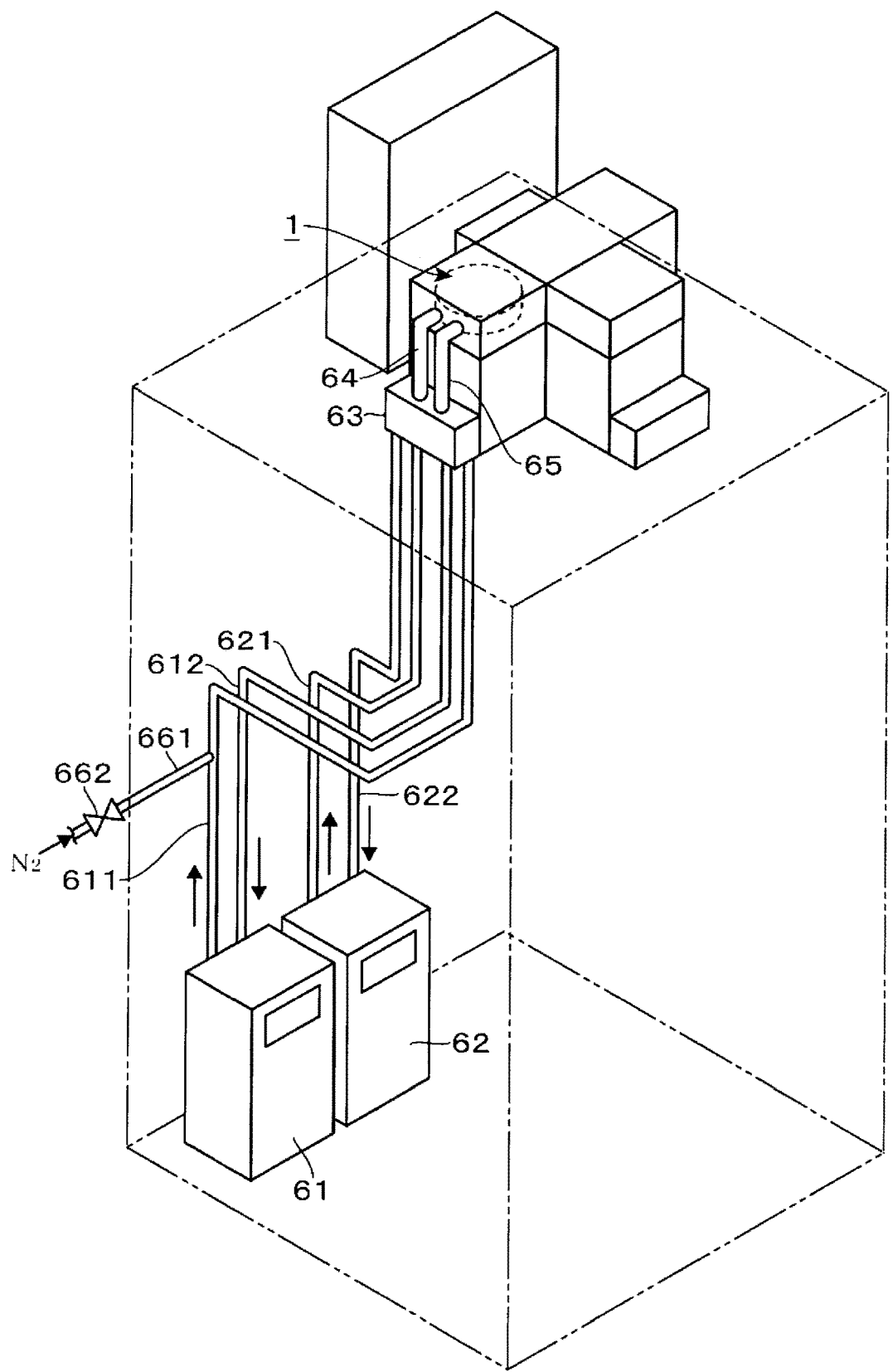
FIG. 6 is a perspective view showing an arrangement state of the substrate processing apparatus.

The supply pipe 247 and the collecting pipe 245 of the case 24 are connected to one ends of a first pipeline 64 and a second pipeline 65 shown in FIGS. 1, 5, and 6, respectively. The other ends of the first pipeline 64 and the second pipeline 65 are connected to a valve unit (VU) 63. For the sake of convenience of illustration, a pair of the first pipeline 64, the second pipeline 65, and the valve unit 63 is shown in FIGS. 1 and 6. However, actually, multiple sets of the first pipeline 64, the second pipeline 65, and the valve unit 63 are disposed as shown in FIG. 5. With this configuration, the main portion 23a of the collective pipe unit 23 is divided into a plurality of zones, where the temperature adjusting liquid may be independently supplied to the first pipe 231 placed in each zone, and may be collected independently from the second pipe 232 placed in each zone.

For the sake of convenience of illustration, in FIG. 5, the supply flow paths 262 and the collecting flow paths 282 that are cavities in the connecting flow path unit 25 as described above are illustrated as separate pipes and the main body of the connecting flow path unit 25 is omitted.

A low temperature liquid supply path 621 has one end that is connected to each valve unit 63, and the other ends of the low temperature liquid supply paths 621 are joined and connected to the temperature adjusting liquid supply port of the low temperature liquid supply unit 62. A low temperature liquid collecting path 622 has one end that is also connected to each valve unit 63, and the other ends of the low temperature liquid collecting paths 622 are joined and connected to the temperature adjusting liquid collecting port of the low temperature liquid supply unit 62. For the sake of convenience of illustration, the description on joining (or branching) of the low temperature liquid supply paths 621 and the low temperature liquid collecting paths 622 is omitted in FIGS. 1 and 6.

The low temperature liquid supply unit 62 is a device for supplying and circulating the temperature adjusting liquid adjusted to a first temperature (hereinafter, also referred to as "low temperature liquid"). The low temperature liquid supply unit 62 collects the temperature adjusting liquid returned from the plurality of valve units 63 through the low temperature liquid collecting paths 622, and adjusts the collected temperature adjusting liquid to the first temperature. Then, the temperature adjusting liquid of the first temperature is supplied to each of the plurality of valve units 63 through the low temperature liquid supply paths 621. The first temperature may be 30° C., for example.

Further, a high temperature liquid supply path 611 is connected to each valve unit 63, and the high temperature liquid supply paths 611 are joined and connected to the temperature adjusting liquid supply port of the high temperature liquid supply unit 61. A high temperature liquid collecting path 612 is also connected to each valve unit 63, and the high temperature liquid collecting paths 612 are joined and connected to the temperature control liquid collecting port of the high temperature liquid supply unit 61. For the sake of convenience of illustration, the description on joining (or branching) of the high temperature liquid supply paths 611 and the high temperature liquid collecting paths 612 is omitted in FIGS. 1 and 6.

The high temperature liquid supply unit 61 is a device for supplying and circulating the temperature adjusting liquid adjusted to a second temperature that is higher than the first temperature (hereinafter, also referred to as "high temperature liquid"). The high temperature liquid supply unit 61 collects the temperature adjusting liquid returned from the plurality of valve units 63 through the high temperature liquid collecting paths 612, and adjusts the collected temperature adjusting liquid to the second temperature. Then, the temperature adjusting liquid of the second temperature is supplied to each of the valve units 63 through the high temperature liquid supply paths 611. The second temperature is higher than a set temperature and may be 120° C., for example. Here, at least one of the low temperature liquid supply unit 62 and the high temperature liquid supply unit 61 may be an example of a liquid receiving unit.

Each valve unit 63 is connected to the supply flow path 262 through the first pipeline 64. Further, the valve unit 63 is connected to the collecting flow path 282 through the second pipeline 65. The valve unit 63 uses a switching mechanism (not shown) formed therein to allow or stop the supply of the temperature adjusting liquid from the high temperature liquid supply unit 61 or the low temperature liquid supply unit 62 to the plurality of first pipes 231 arranged in the respective zones. Further, each valve unit 63 switches the low temperature liquid supplied through the low temperature liquid supply paths 621 and the high temperature liquid supplied through the high temperature liquid supply paths 611 in a pulsed manner, and adjusts an average temperature of the temperature adjusting liquid supplied to the plurality of first pipes 231 arranged in the respective zones.

For example, a fluorine-based liquid having a boiling point of 100° C. or higher may be used as the temperature adjusting liquid supplied from the high temperature liquid supply unit 61 and the low temperature liquid supply unit 62.

A connecting flow path 60 may be provided between the high temperature liquid supply unit 61 and the low temperature liquid supply unit 62 to control the storage amount of the liquid by exchanging the temperature adjusting liquid with each other (see FIG. 1). The high temperature liquid supply unit 61 and the low temperature liquid supply unit 62 correspond to a liquid supply unit of this example.

In the substrate processing apparatus 1 having the above-described configuration, deposits may be adhered to the surface of the stage 2 as the wafer W is processed using the processing gas. For example, the processing gas for film formation reaches the backside of the wafer W (the substrate supporting area side) and generates deposits even on the substrate supporting area facing the backside of the wafer W in addition to a peripheral portion of the substrate supporting area for the wafer W on the upper surface of the stage 2. Further, the substances removed from the wafer by the processing gas for etching may be adhered to the peripheral portion of the substrate supporting area.

If these deposits are peeled off from the stage 2, they may become particles and a contamination source that adheres to the wafer W. Therefore, the substrate processing apparatus 1 of this example is provided with a heater for heating the stage 2 to remove the deposits.

In the example shown in FIG. 1, the heater is configured as a heating lamp 33 that is a heating light source for heating the stage 2 by radiant heat.

As shown in FIG. 1, in the substrate processing apparatus 1 of this example, the heating lamp 33 is accommodated in a lamp cover 342 provided in the electrode plate 31 located above the stage 2. When power is supplied from a power source (PS) 35 to each heating lamp 33, the heating lamp 33 emits light having a predetermined wavelength such as infrared rays. The bottom surface of the lamp cover 342 is provided with a window 341 capable of transmitting the light emitted from the heating lamp 33. The light passing through the window 341 is irradiated on the upper surface of the stage 2 through the opening 312 formed in the electrode plate 31, and the temperature of the stage 2 that absorbs the light is increased.

Here, in order to remove the deposits adhered to the stage 2, it may be necessary to heat the surface of the stage 2 to about 300° C., for example. In order to promote the removal of the deposits, it may be necessary to lower the heating temperature of the stage 2 by supplying remote plasma of a processing gas for etching. Even in such case, it may be necessary to heat the stage 2 to about 200° C.

On the other hand, the temperature adjusting liquid having the set temperature of the high temperature liquid of about 120° C., as described above, may be boiled and decomposed when heated up to about 200° C. When fluorine-based liquid is used as the temperature adjusting liquid, the fluorine-based liquid may be decomposed to generate a fluorine gas. Therefore, it is difficult to clean the stage 2 in which the temperature of the wafer W is adjusted using the temperature adjusting liquid.

Therefore, the substrate processing apparatus 1 of this example is provided with a gas supply unit for replacing the temperature adjusting liquid with a gas in the stage 2 during cleaning thereof. As shown in FIGS. 1 and 6, the gas supply unit of this example is configured to supply a nitrogen gas as the gas to the high temperature liquid supply path 611 before branching, which is located at a downstream side of the supply port of the high temperature liquid supply unit 61. Further, the nitrogen gas is not necessarily supplied to the position described in this example, and may be directly introduced into, for example, the first pipeline 64 connected to each valve unit 63.

A nitrogen gas supply line 661 having a valve 662 for allowing or stopping the supply of the nitrogen gas is connected to the high temperature liquid supply path 611, and a nitrogen gas supply unit (N) 66 is provided at an upstream side of the nitrogen gas supply line 661. The nitrogen gas supply unit 66 includes a nitrogen gas supply source or a nitrogen gas flow rate adjusting mechanism. A nitrogen cylinder may be used as the nitrogen gas supply source, or the nitrogen gas may be supplied from a power supply system of a factory in which the substrate processing apparatus 1 is installed. The nitrogen gas supply unit 66 or the nitrogen gas supply line 661 constitutes a gas supply unit of this example.

As shown in FIG. 1, the substrate processing apparatus 1 having the above-described configuration is provided with a controller (CNT) 100 including a computer, and a program is stored therein. This program includes a group of steps for transmitting a control signal to each part of the substrate processing apparatus 1 to control the operation of each part and to execute each process on the wafer W. Based on this program, the processing of the wafer W using the processing gas or the cleaning operation of the stage 2 is controlled. The program is installed in the controller 100 from a storage medium such as a hard disk, a compact disk, a magneto-optical disk, a memory card, or the like.

Figure 7:
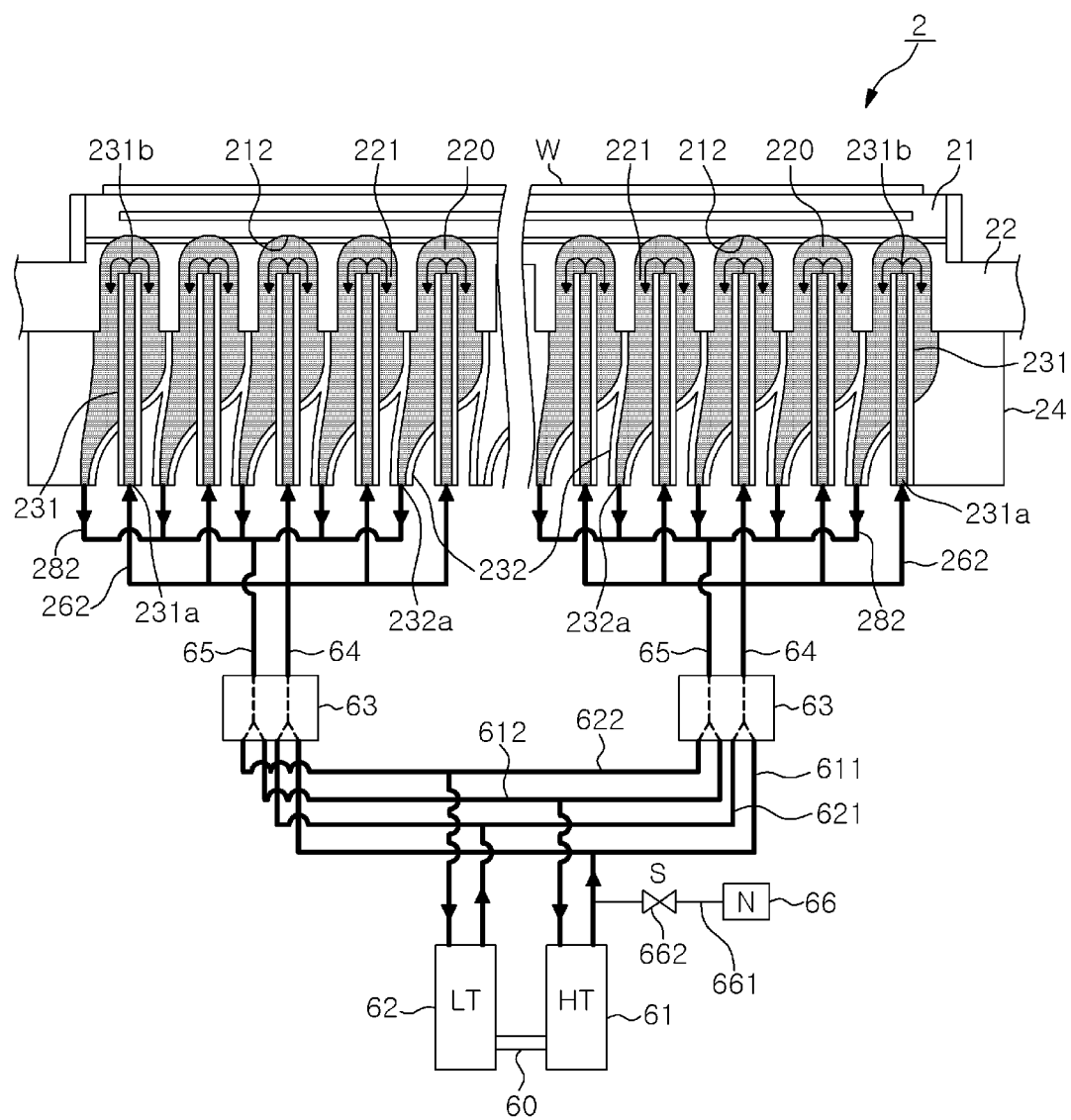
FIG. 7 is a first explanatory view illustrating an operation of the stage.
Figure 8:
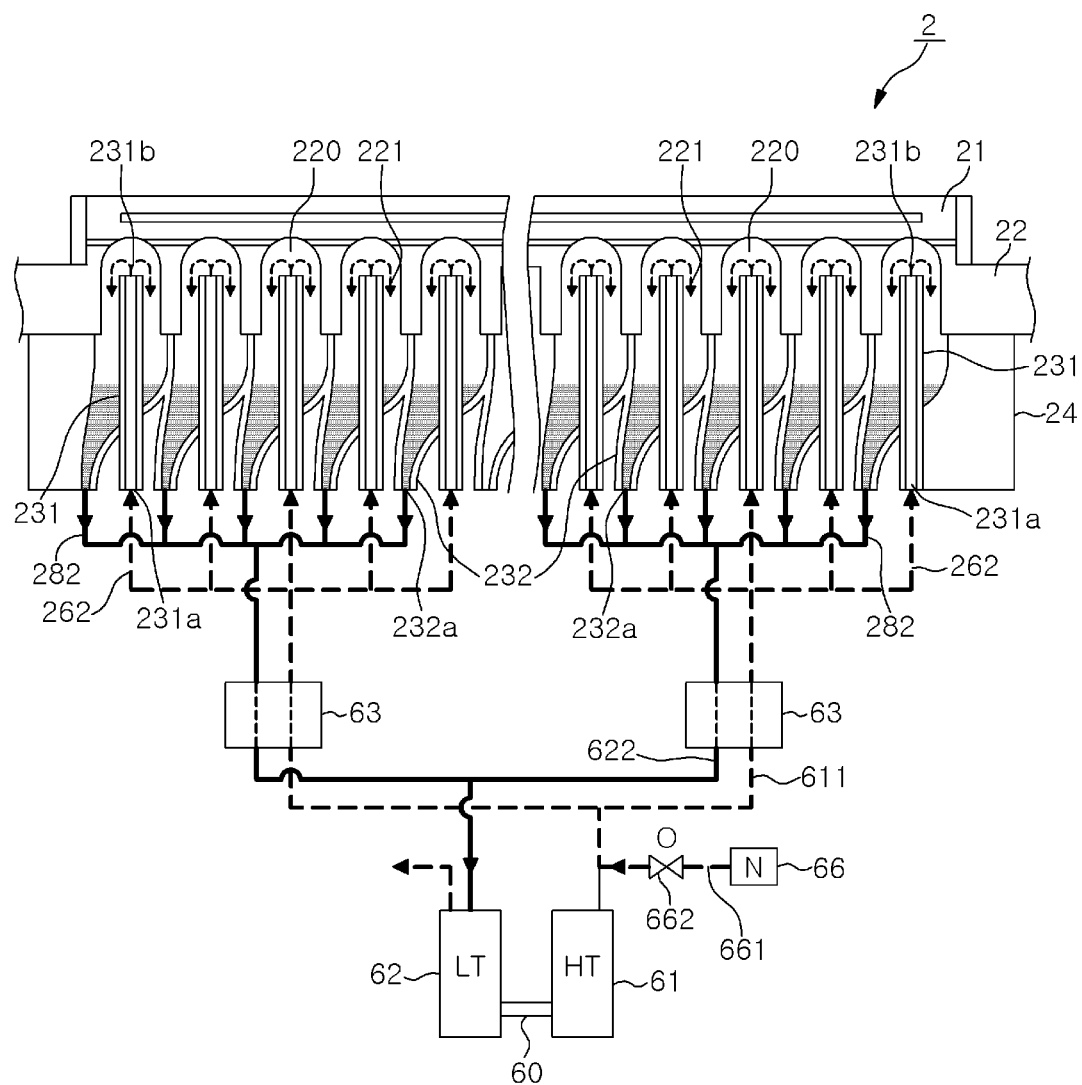
FIG. 8 is a second explanatory view illustrating the operation of the stage.
Figure 9:
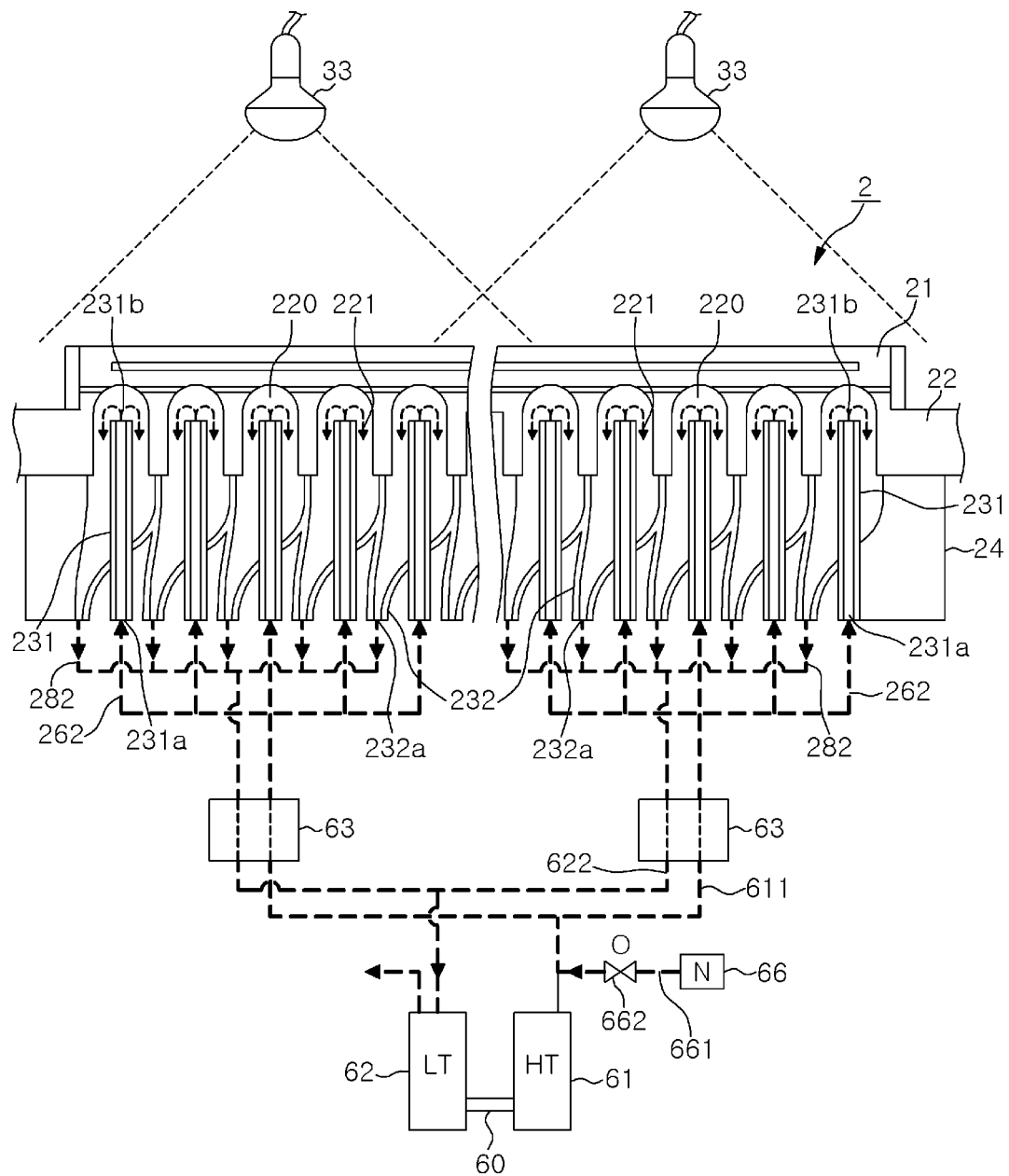
FIG. 9 is a third explanatory view illustrating the operation of the stage.

Hereinafter, the operations of the substrate processing apparatus 1 of the present disclosure in the case of performing, for example, film formation, will be described with reference to FIGS. 7 to 9. FIGS. 7 to 9 schematically illustrate the internal state of the stage 2 at various points at the time of processing the wafer W, preparing for cleaning the stage 2, and performing the cleaning. In FIGS. 7 to 9, the flow of the temperature adjusting liquid is indicated by solid arrows, and the flow of the nitrogen gas is indicated by broken arrows. Further, the region where the temperature adjusting liquid exists in the flow paths of the stage 2 is represented by gray tone. Further, in order to avoid making the drawings complicated, the flow paths that are not currently used (the low temperature liquid supply path 621 and the high temperature liquid collecting path 612) are omitted in FIGS. 8 and 9.

At the time of processing the wafer W, the wafer W is loaded into the chamber 11 through the loading/unloading port 12 and placed on the stage 2. Then, a pressure in the processing space 110 and a temperature of the wafer W are adjusted.

In controlling the temperature, the supply ratio of the low temperature liquid/high temperature liquid is controlled by switching the low temperature liquid (e.g., 30° C.) supplied from the low temperature liquid supply unit 62 and the high temperature liquid (e.g., 120° C.) supplied from the high temperature liquid supply unit 61 in a pulsed manner using the valve unit 63. Accordingly, the average temperature of the temperature adjusting liquid supplied to the first pipe 231 placed in each zone of the stage 2 can be adjusted. Since it is difficult to show in one drawing the switching of the low temperature liquid and the high temperature liquid in a pulsed manner, FIG. 7 shows a state where the high temperature liquid and the low temperature liquid are supplied in parallel, for the sake of convenience of illustration.

For example, in the case of conventional film formation performed by heating the wafer W to about 200° C. to 300° C., it is required to lower the heating temperature of the wafer W to about 80° C. to 150° C. in order to reduce damage to the semiconductor devices formed on the wafer W.

On the other hand, in the stage having a conventional structure, the wafer W is typically heated using a heater electrode for resistance heating. In this example, a heater electrode placed on an upper surface side of the stage is covered with sprayed ceramics, or bulk ceramics in which a heater electrode is embedded is adhesively fixed to an upper surface of a stage main body.

However, when the power supplied to the heater electrode is small, it is difficult to perform stable temperature control. Therefore, in the case of performing low temperature heating, a coolant flow path is formed in the stage below the heater electrode, and power capable of heating the stage to a temperature higher than a target temperature is supplied to the heater while allowing the coolant to flow through the coolant flow path. With this configuration, stable low temperature heating is implemented by forcibly discharging a part of generated heat to the coolant side.

On the other hand, in the stage 2 of this example shown in FIG. 7, the temperature of the wafer W is controlled by making the temperature adjusting liquid adjusted to a temperature approximately the same as the heating temperature of the wafer W in direct contact with the back surface of the electrostatic chuck 21. Therefore, forcible heat discharge to the coolant is not required, so that the thermal efficiency is improved compared with the conventional method using the heater electrode.

In particular, as indicated by arrows in the cell portion 220 in FIG. 7, the temperature adjusting liquid discharged from the second open end 231b at the upper end side of the first pipe 231 changes its flow direction after colliding with the back surface of the electrostatic chuck 21 that is placed above the discharge position and exposed toward the through hole 221. Due to such flow, it is possible to suppress formation of a boundary layer of the temperature adjusting liquid on the back surface of the electrostatic chuck 21 and to transfer heat efficiently.

Further, since the electrostatic chuck 21 is adhered to the plate 22 (the upper surface of the wall 222) by the adhesive layer 213 in the area other than the area exposed toward the through hole(s) 221, the heat of the temperature adjusting liquid is directly supplied to the electrostatic chuck 21 without passing through the layer 213. Therefore, it is also possible to heat the electrostatic chuck efficiently using the temperature adjusting liquid.

The wafer W placed on the stage 2 is adjusted to a temperature within a range of 80° C. to 150° C., for example, 100° C., by the above-described method. Further, when the pressure adjustment of the processing space 110, which has been performed in parallel with the temperature adjustment of the wafer W, is completed, the RF power is applied to the stage 2 from the first RF power supply 41 and the matching box 42. Further, the processing gas for film formation is supplied into the processing space 110 from the gas injection hole 311.

As a result, the film forming gas is converted into plasma and reacts on the surface of the heated wafer W to perform the film formation. After the film formation is performed for a predetermined time, the supply of the processing gas and the application of the RF power are stopped, and the pressure in the processing space 110 is adjusted. Then, the wafer W is unloaded in a reversed sequence of the loading process.

After the wafer W is unloaded, the supply of the temperature adjusting liquid to the stage 2 may be continued to maintain the stage 2 at the temperature for the film formation (in the above-described example, about 100° C.), or the temperature of the stage 2 may be lowered by changing the supply ratio of the high temperature liquid and the low temperature liquid using the valve unit 63.

When the wafers W that are sequentially loaded are processed in the above-described procedure, the deposits due to the reaction of the processing gas are adhered to the surface of the stage 2. Therefore, cleaning of the stage 2 is performed, for example, when a predetermined number of wafers W are processed or when a predetermined time has elapsed from the previous cleaning.

The stage having the conventional structure can be heated to the temperature for cleaning using the heater electrode for heating the wafer W. On the other hand, in this example, the temperature adjusting liquid for heating the wafer W is unable to heat the stage 2 to the temperature necessary for cleaning, about 200° C. to 300° C. Therefore, as described above, the stage 2 in the substrate processing apparatus 1 of this example is heated using the heating lamp 33 to perform cleaning.

However, when the stage 2 is heated with the temperature adjusting liquid remaining in the flow paths (the cell portion 220, the first pipe 231, and the second pipe 232), there is a risk that the temperature adjusting liquid is boiled and decomposed to generate fluorine. Therefore, the substrate processing apparatus 1 of this example switches the fluid to be supplied to the stage 2 from the temperature adjusting liquid supplied from the high temperature liquid supply unit 61 and the low temperature liquid supply unit 62 to the nitrogen gas supplied from the nitrogen gas supply unit 66 to replace the fluid in the flow path with the nitrogen gas.

FIG. 8 shows that the valve 662 is opened to supply the nitrogen gas from the nitrogen gas supply unit 66 to the stage 2 and the nitrogen gas discharged from each first pipe 231 pushes the temperature adjusting liquid in the cell portion 220 and the second pipe 232 toward a downstream side to replace the temperature adjusting liquid. The temperature adjusting liquid discharged from the stage 2 is collected to the low temperature liquid supply unit 62 through the low temperature liquid collecting path 622.

FIG. 8 shows that the temperature adjusting liquid in the stage 2 is uniformly discharged in each zone. However, the temperature adjusting liquid in each flow path may be discharged unevenly due to the differences in the sizes of the zones or the flow rates of the nitrogen gas. In such a case, a gas-liquid mixed flow of the temperature adjusting liquid and the nitrogen gas flows into the low temperature liquid supply unit 62. The nitrogen gas is separated from the temperature adjusting liquid in a tank (not shown) of the low temperature liquid supply unit 62, and is discharged to the outside.

Further, since the temperature adjusting liquid is collected only to the low temperature liquid supply unit 62, the storage amount of the temperature adjusting liquid between the high temperature liquid supply unit 61 and the low temperature liquid supply unit 62 may be unbalanced. In such a case, a part of the temperature adjusting liquid may be transferred from the low temperature liquid supply unit 62 to the high temperature liquid supply unit 61 through the connecting flow path 60.

After the fluid in the stage 2, i.e., the temperature adjusting liquid, is replaced with the nitrogen gas, the high temperature liquid supply unit 61 and the low temperature liquid supply unit 62 are in a standby state while adjusting the temperature of the temperature adjusting liquid.

Then, a power is supplied from the power source 35 to the heating lamp 33 to irradiate a heating light on the entire upper surface of the stage 2 on which the wafer W is not placed, and the stage 2 is heated by radiant heat to a temperature range of, for example, 200° C. to 300° C. As a result, the deposits adhered to the stage 2 is decomposed and removed. Further, at the time of the cleaning, remote plasma of an etching gas may be supplied into the processing space 110 to promote the cleaning.

Further, as shown in FIG. 9, during the cleaning period, the supply of the nitrogen gas to the flow paths (the cell portion 220, the first pipe 231 and the second pipe 232) in the temperature adjusting liquid flow paths 20 may be continued. For example, the nitrogen gas is supplied to the flow paths at a temperature close to a room temperature. Therefore, the nitrogen gas can be used as a coolant for preventing excessive temperature increase of components such as the plate 22 or the case 24 and protecting the components.

Even when the fluid flowing through the flow paths is switched to a gas that is the nitrogen gas, (i) the heat can be transferred efficiently due to collision of the nitrogen gas discharged from the first pipe 231 with the back surface of the electrostatic chuck 21, and (ii) the electrostatic chuck 21 can be cooled down efficiently by directly supplying the nitrogen gas to the back surface of the electrostatic chuck 21 without passing through the first pipe 231.

Further, in order to reduce the influence on the cleaning due to the continuous supply of the nitrogen gas, the flow rate of the nitrogen gas may be reduced during the cleaning period compared to that during the replacement of the temperature adjusting liquid with the nitrogen gas.

After the cleaning is performed for a predetermined time, the power supply to the heating lamp 33 is stopped and the heating of the stage 2 is completed. In the case of using remote plasma, the supply of plasma is also stopped. On the other hand, the supply of the nitrogen to the stage 2 may be continued to facilitate the cooling of the stage 2 to a temperature at which the temperature adjusting liquid is not boiled or decomposed even if it is supplied.

When the stage 2 is cooled down to a predetermined temperature, the high temperature liquid supply unit 61 and the low temperature liquid supply unit 62 start to supply the temperature adjusting liquid to adjust the temperature of the stage 2. Then, the processing of the wafer W is restarted.

In accordance with the substrate processing apparatus 1 of the above-described embodiment, the stage 2 can be cleaned while reducing generation of decomposed substances due to boiling and decomposition of the temperature adjusting liquid at the time of heating the stage 2.

Here, the cleaning of the stage 2 is not necessarily performed by heating the stage 2 using the heating lamp 33. For example, it is not necessary to heat the entire upper surface of the stage 2 to remove the deposits adhered in an annular shape around the substrate supporting area for the wafer W. In this case, a tubular member in which a heater electrode for resistance heating of the tubular member is embedded may be provided to surround the stage 2 at its circumferential surface, and an upper end of the tubular member may be bent inward to be in contact with a peripheral area of the electrostatic chuck 21, may be used. Then, the peripheral area of the electrostatic chuck 21 may be heated and cleaned by heat transfer from the tubular member.

Also in the example using the above tubular member, the fluid in the stage 2 is replaced with the nitrogen gas to prevent the temperature adjusting liquid from being boiled and decomposed. At this time, for example, the collective pipe unit 23 may be divided into zones corresponding to the central side and zones corresponding to the peripheral side of the collective pipe unit 23, and only the fluid in the zones corresponding to the peripheral side where the temperature adjusting liquid reaches the boiling point and the decomposition temperature may be replaced with the nitrogen gas for cleaning.

When a heater is provided at a stage 2 side (i.e., the heating lamp 33 is not used) as in the case of the above-described heating using the tubular member, a shower head with a plurality of gas injection holes may be used instead of the electrode plate 31 shown in FIG. 1.

Figure 10:
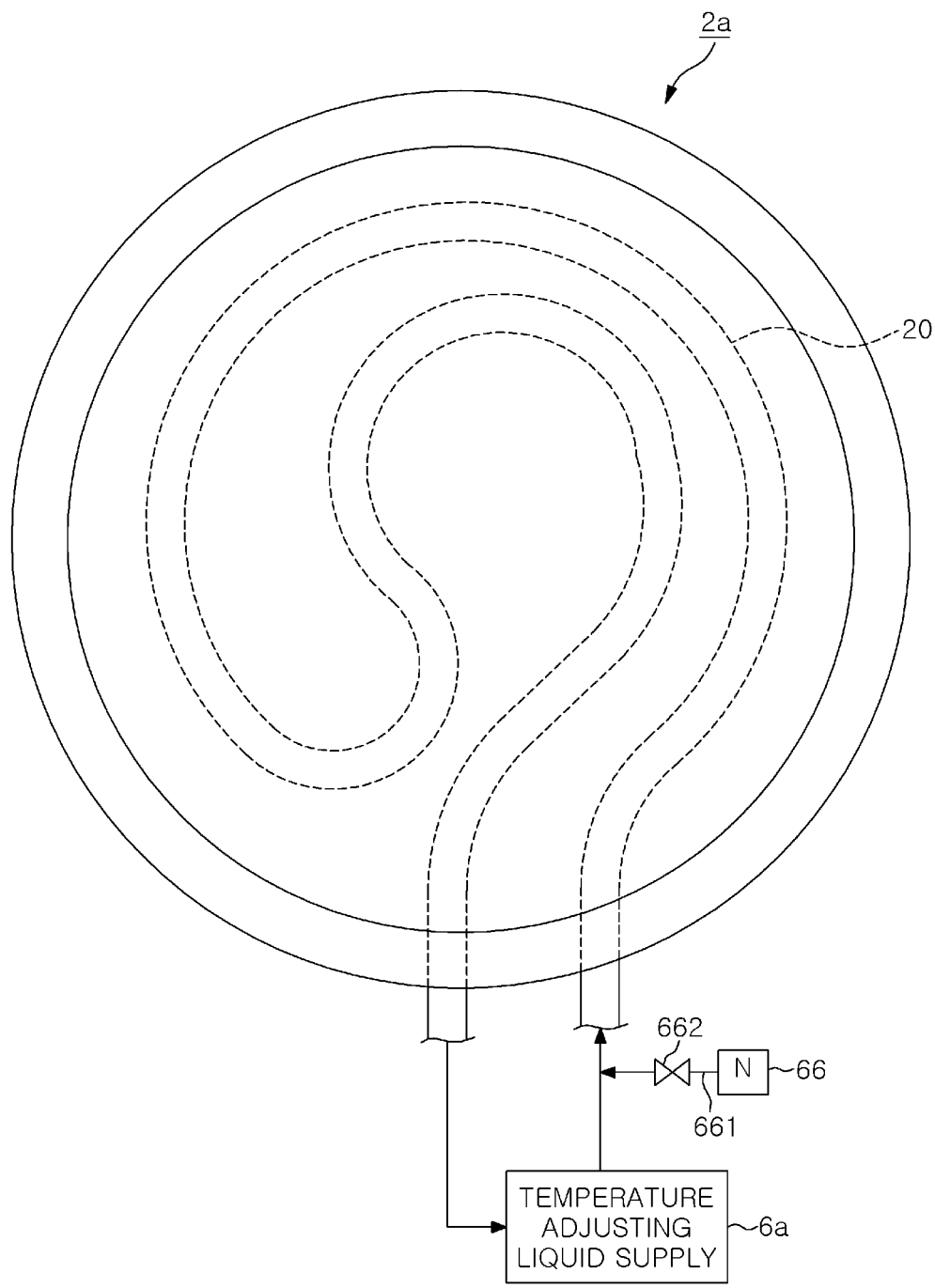
FIG. 10 is a plan view of a stage according to another embodiment.

Further, the technique of the present disclosure is not necessarily applied to the stage 2 having the flow paths including the cell portion 220, the first pipe 231, and the second pipe 232 shown in FIG. 4. The technique of the present disclosure may be also applied to a stage 2a having a temperature adjusting liquid flow path 20 that is spirally formed along a substrate supporting surface of the wafer W as in the example shown in the plan view of FIG. 10. Also in the stage 2a, during the cleaning, the nitrogen gas is supplied instead of the temperature adjusting liquid supplied from a temperature adjusting liquid supply 6a to replace the fluid in the temperature adjusting liquid flow path 20.

Further, the temperature adjusting liquid that can be used for temperature control of the stages 2 and 2a is not limited to the fluorine-based liquid that may be boiled and decomposed by heating to a temperature higher than a usable temperature range and generate a fluorine gas. For example, the technique of the present disclosure can be applied even when pressurized water, lubricating oil, or hydraulic oil is used as the temperature adjusting liquid. When the pressurized water is heated to a temperature higher than a usable temperature range and brought into contact with a metal, a hydrogen gas may be generated due to catalytic reaction. Further, the heating of the lubricating oil and hydraulic oil to a temperature higher than a usable temperature range is not desirable. Also in these cases, during cleaning, the temperature adjusting liquid in the flow paths (the cell portion 220, the first pipe 231 and the second pipe 232 of the stage 2, and the temperature adjusting liquid flow path 20 of the stage 2a) may be replaced with a gas such as a nitrogen gas or the like to suppress generation of a hydrogen gas or overheating of the lubricating oil and hydraulic fluid.

In addition, the temperature adjusting liquid is not necessarily used for heating the wafer W, and may be used for cooling the wafer W.

The gas replaced with the temperature adjusting liquid is not limited to the nitrogen gas, and an argon gas or clean air may be used.

Further, the processing of the wafer W performed in the substrate processing apparatus 1 with the stage 2 or 2a may be ashing for removing photoresist using plasma, in addition to the above-described film formation or etching.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A substrate processing apparatus, comprising:
a stage on which a target substrate is placed;
a liquid supply unit configured to supply liquid for heating the target substrate into a first temperature range to the stage, the liquid supply unit comprising:
 a low temperature liquid supply unit configured to supply the liquid adjusted to a first predetermined temperature; and
 a high temperature liquid supply unit that is distinct from the low temperature liquid supply unit, the high temperature liquid supply unit configured to supply the liquid adjusted to a second predetermined temperature that is greater than the first predetermined temperature;
a low temperature liquid supply path having a first end connected to the low temperature liquid supply unit;
a high temperature liquid supply path having a first end connected to the high temperature liquid supply unit;
a valve unit connected to a second end of the low temperature liquid supply path and a second end of the high temperature liquid supply path, the valve unit comprising a switching mechanism inside the valve unit and configured to control a supply ratio of the liquid supplied through the low temperature liquid supply path and the liquid supplied through the high temperature liquid supply path;
a flow path formed in the stage and through which the liquid supplied from the valve unit flows;
a heater configured to heat the stage to a second temperature higher than the first temperature range to remove deposits adhered to the stage;
a gas supply unit connected to the high temperature liquid supply path and configured to supply a gas to the flow path; and
a controller,
wherein the controller is configured to switch a fluid in the flow path from the liquid supplied from the liquid supply unit to the gas supplied from the gas supply unit, and to control the heater to heat the stage to the second temperature after replacement of the fluid in the flow path with the gas, and
wherein the controller is configured to use the gas to push the liquid in the flow path into the low temperature liquid supply unit of the liquid supply unit which is configured to receive the liquid and gas discharged from the flow path, and further comprises a tank for performing gas-liquid separation of the discharged liquid and gas.

2. The substrate processing apparatus of claim 1, wherein the stage includes:
a plate having a surface disposed to face the target substrate and a back surface opposite to the surface;
a plurality of first pipes that are arranged to be spaced apart from each other below the plate, each of the plurality of first pipes being extended upward and having an open end that opens toward the back surface of the plate, and form a part of the flow path;
a plurality of partition walls each of which is configured to surround each of the plurality of first pipes, the plurality of partition walls forming a plurality of spaces that are a part of the flow path; and a plurality of second pipes connected to the plurality of partition walls to respectively communicate with the plurality of spaces and forming a part of the flow path, wherein the flow path is configured so that the fluid flowing in the flow path is discharged from each open end of the plurality of first pipes toward the back surface of the plate, and then flows into the plurality of second pipes through each of the plurality of spaces around each of the plurality of first pipes, and then is discharged out of the flow path.

3. The substrate processing apparatus of claim 1, wherein the heater is a heating light source configured to heat the stage by radiant heat.

4. The substrate processing apparatus of claim 2, wherein the heater is a heating light source configured to heat the stage by radiant heat.

5. The substrate processing apparatus of claim 1, wherein the second temperature higher than the first temperature range is a temperature at which the liquid decomposes.

6. The substrate processing apparatus of claim 2, wherein the second temperature higher than the first temperature range is a temperature at which the liquid decomposes.

7. The substrate processing apparatus of claim 1, wherein the liquid is used to heat the target substrate placed on the stage to a temperature higher than or equal to 80° C. and lower than or equal to 150° C.

8. The substrate processing apparatus of claim 2, wherein the liquid is used to heat the target substrate placed on the stage to a temperature higher than or equal to 80° C. and lower than or equal to 150° C.

* * * * *